METHOD FOR INTERCONNECTING CONTACT LAYERS OF A CIRCUIT BOARD

Filed Aug. 18, 1971

INVENTORS
Werner Schmidt
Hubert Zukier

BY Hill, Sherman, Meroni, Gross & Simpson
ATTYS.

United States Patent Office 3,764,436

Patented Oct. 9, 1973

3,764,436

METHOD FOR INTERCONNECTING CONTACT LAYERS OF A CIRCUIT BOARD

Werner Schmidt and Hubert Zukier, Munich, Germany, assignors to Siemens Aktiengesellschaft, Berlin and Munich, Germany Filed Aug. 18, 1971, Ser. No. 172,676
Claims priority, application Germany, Aug. 24, 1970, P 20 41 949.2
Int. Cl. H05k *3/00*
U.S. Cl. 156—288 10 Claims

ABSTRACT OF THE DISCLOSURE

A method for interconnecting contact layers of a circuit board having an interposed insulating layer of epoxy resin characterized by superimposing a layer of epoxy resin with reinforcing glass fibers between two conducting layers carried on layers of insulating material, each of the conducting layers including at least one contact point provided with a coating of bonding metal, heating the stack to a temperature above the curing temperature of the epoxy resin and below the melting point of the bonding metal so the resin becomes liquid and begins to jell, and then applying pressure to the stack to press the contact points against the jelling epoxy resin to force it and its reinforcing glass fibers from between the points to obtain engagement of the surfaces of the coatings of bonding metal which coatings of bonding metal is due to the temperature and pressure conditions form an integral bond between the contact point to form a connection between its separated conducting layers.

BACKGROUND OF THE INVENTION

Field of the invention

The present invention is directed to a method of forming circuit boards having two contacting layers separated by an insulating layer and in particular, a method of forming an electrical connection between the two contacting layers through the insulating layer.

Prior art

In the prior art, circuit boards for electrical components or component groups are known and include two contact layers separated by an insulating layer which contact layers are interconnected through the insulating layer at predetermined points in the circuit board.

In the prior art methods of making such circuit boards, one method provides forming holes in the insulating layer at the point where the contact is to be made and then forcing the metal contacting layers through the hole into contact for bonding by welding. Such a method has the disadvantages of requiring the formation of holes in the desired position on the insulating layer and a problem of aligning the contact layers and the holes. Furthermore, such a method requires the bending at the point of connection of the contact layers from their plane which causes stretching and reduces the mechanical strength of the interconnected contact layers.

To avoid these disadvantages, it has been suggested in the prior art methods to weld an intermediate connecting part between the two contact layers which are separated by the layer of insulating material. However, the positioning of these intermediate parts and their welding to the two contact layers requires additional manipulative operations which increase the production cost of the circuit panel or board.

Another suggested method for producing a multi-layer circuit board having conductive layers separated by an insulating layer is to provide pressure at the point of the connection to force the layers through the insulating layer and obtain a welding therethrough. While such a method dispenses with the provision of the holes in the insulating layer, the mechanical stresses applied to the conducting layers causes mechanical weakness in the board. Furthermore, such a method requires access to each of the layers to be interconnected and thus in a circuit board having multi-layers with multiple connections some of which are separated from the outer surface by insulating layers requires the formation of the board one layer at a time.

A further solution for forming the circuit board which has multiple layers of conducting material separated by layers of insulating materials with connections therebetween is the formation of a stack of an insulating layer having holes at the desired position, and the layers of the conducting material provided with solder layer. Then by use of hot dies, the solder on the conducting layers form a connection through the hole provided in the insulating layer. However, as mentioned above, this process requires alignment of the solder layer, of the conducting layers with the apertures formed in the insulating layer which increases cost for manufacturing.

SUMMARY OF THE INVENTION

The present invention provides a method of making a circuit board which has at least two conducting layers separated by a layer of insulating material which conducting layers are interconnected at predetermined points by electrical connections through the insulating layer. The method is accomplished by forming a stack having an insulative layer of soft or partially hardened epoxy resin which is reinforced with glass fibers, disposed between two conducting layers each of which includes at least one contact point with a coating of bonding metal, heating the stack to a temperature between the curing temperature of the resin at which the epoxy resin becomes molten and then begins to jell, and below the temperature of the melting points for the bonding metal, and while the stack is in the heated condition, applying pressure to the stack to press the contact points against the epoxy resin layer to force the jelling epoxy resin and reinforcing glass fibers from between the contact points to enable the aligned contact points to come into surface engagement with each other so that the bonding metal under the temperature and pressure conditions forms a bond between the contact points and an electrical connection. Preferably, the conducting layers are supported on individual insulating layers which are not subject to softening at the temperature utilized to soften the epoxy resin layer which temperature is preferably 180° C. The bonding metal may be solder which has a melting point above 220° C. or be constituents of a solder alloy having a lower melting point which constituents have a melting point temperature above 220° C. If the bonding metal are constituents of a solder alloy, they alloy together when in contact under the temperature and pressure condition to form a solder alloy at their interface which fuses to form the bond between the contact points.

DESCRIPTION OF THE PREFERRED EMBODIMENT

Figure 1:
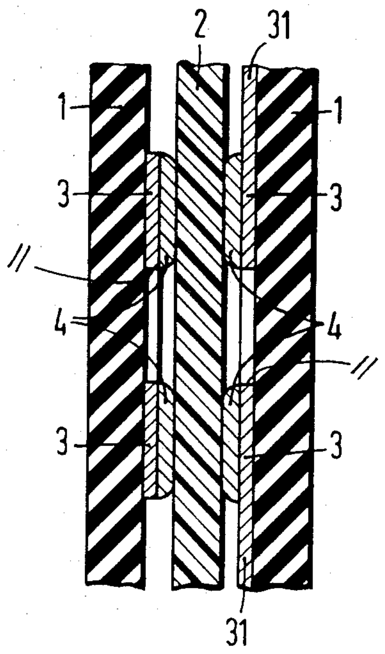
FIG. 1 is a cross-sectional view of a stack of the layers prior to the heating and pressing steps of the method.
Figure 2:
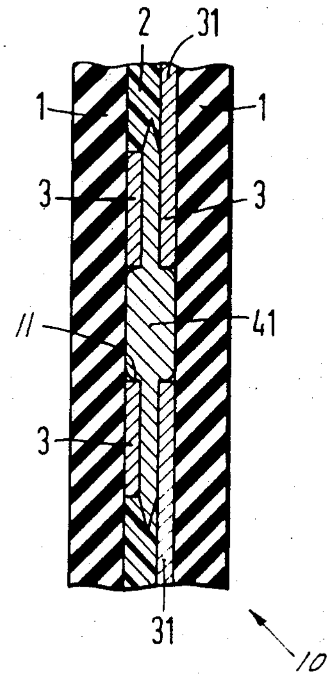
FIG. 2 is a cross section of the circuit board after completion of the method to form the interconnection between the conducting layers.

The principles of the present invention are particularly useful in forming a circuit board generally indicated at 10 in FIG. 2. The circuit board 10 has a pair of insulative layers 1 separated by a layer of epoxy resin 2. Each of the layers 1 is provided with electrical conducting layers facing the epoxy resin layer 2. Each of the conducting layers include at least one contact point 3 which may be part of a circuit layer or path such as 31 which path has the desired circuit configurations. The contact points 3 are bonded together by bonding metal 41 to form an electrical connection across the insulating layer 2 of epoxy resin.

The form the circuit board 10, at least two insulative layers 1, which are each provided with a conducting layer including the contact points 3 on a surface thereof, are arranged on opposite sides of a layer 2 of the epoxy resin with the conducting layers facing each other and the layer 2 with the contact points 3 in alignment. Each of the contact points 3, which are illustrated as having an annular configuration with a center opening 11 to form a contact eye, are provided with a coating of a bonding metal which coating is preferably applied by a galvanic coating process such as electroplating which enables exact control over the thickness of the coatings 4. However, it is possible to apply the coatings 4 of bonding metal mechanically in the liquid state such as for example any flooding process while the remaining surfaces, which are to be free of the coating, are screened with appropriate lacquer or masking materials.

The material used in insulating the layer 2 is either an epoxy resin, which is reinforced with a mat of glass fibers, that is in an uncured or partially cured state. The epoxy material when heated to a final hardening or curing temperature begins to soften to a liquid condition and then begins to transform by jelling. Preferably, the epoxy material is selected to have a final hardening or curing temperature in which it becomes a liquid or in the jelly state at a temperature less than 180° C.

The coatings 4 of bonding metal are preferably a soft solder or constituents of a soft solder alloy which coatings have a melting point above the final hardening or curing temperature for the epoxy resin such as 220° C. and will remain substantially rigid at the hardening temperature for the epoxy resin. The material for the layers 1 which support the contact points 3 is to be unaffected at the final hardening or curing temperature for the epoxy resin.

In the method, the stack formed of the insulating layers 1 sandwiched around an insulating layer 2 with the conductive layers and contact points 3 in facing relationship is heated to the final hardening or curing temperature for the epoxy resin of the layer 2 such as 180° C. At this temperature, the resin of the layer 2 begins to liquify and then starts to jell. While in this condition, a pressure is applied to the stack at about 1.4 tons per square decimeter. The result of applying the pressure forces the contact points 3 together to squeeze or push aside the epoxy resin and the thin mat of reinforcing glass fibers to allow surface contact between the coatings 4 of bonding metal. Under the condition of the temperature and pressure, the bonding metal forms a bond across the interface of each of the coatings 4 to electrically interconnect the contact points 3 and therefore their respective conducting layers. If necessary, after the contact points have pushed the resin away, the temperature may be raised a small amount to improve the formation of the bond. In forming the bond, excess bonding metal, which may be in a molten state, collects in the center openings 11 of the annular contact points 3 while forming the bond 41 as illustrated in FIG. 2. From experimentation, it is noted that the excess bonding metal always collects in the center openings 11 of the annular contact points 3 as long as the quantity of the bonding metal in the layers 4 was maintained within reason and therefore the excess bonding metal does not form a short circuit between conducting layers.

If the bonding material is a solder alloy and if the coatings 4 are constituents of the alloy, it is known that constituents of an alloy generally have a higher melting point than the alloy made therefrom. Thus, by selectively applying constituents of the solder alloy as the coatings 4, the coatings on the contact points 3 will have a higher melting point than the solder alloy made by the alloying of the two constituents. Thus, if the solder alloy has a melting point temperature which is the same or lower than the curing temperature, but its constituents have a melting point higher than the curing temperature such as higher than 220° C., then the constituents will remain rigid until they come in contact under the temperature and pressure and begin to form the solder alloy at the interface of the contact coating which solder alloy will melt to form a solder bond between the contact points 3. Thus, by selecting the desirable solder alloy those constituents have higher melting points and are separately coated on the aligned contact points, the coatings 4 remain rigid during the pressing operation and until they become engaged with each other to start diffusing to form the solder alloy which is molten at the temperature maintained during the pressing operation.

At the completion of the forming of the circuit board 10, necessary apertures in the board for receiving electrical leads or connections from components to be applied to the board can be formed by perforating the board through the bonded contact point preferably at the center openings 11.

The present method has the advantages that the cured epoxy resin layer glues or fastens the conducting layer and insulating layer 1 together with the conducting layers remaining substantially planar even at the contact points 3 and the outer surfaces of the insulating layers 1 remain substantially level after the final step of the method. Thus, informing the electrical connection through the epoxy insulating layer, the conducting layers are not mechanically stressed to weaken their structural properties or mechanical properties. Unlike several of the prior art processes the dies can have plane surfaces instead of being contoured to apply pressure only at the contact points and thus the dies can be used to form boards having different circuits and locations for the contact points.

Finally, if a circuit board is to have multi-layers of more than two layers of conducting elements separated by insulating layers, the various conducting layers are sandwiched about insulating layers 2 of epoxy resin with the final assembly sandwiched between the outer insulating layers 1. The application of the pressure after applying the heat will cause the aligned contact points to squeeze the epoxy resin therebetween and form the connection without affecting or disturbing other conducting layers and layers 2 of epoxy resin adjacent to the point of forming the contact. Thus, the method is very beneficial in forming circuit boards having internal connections between conducting layers.

Although minor modifications might be suggested by those versed in the art, it should be understood that we wish to embody within the scope of the patent warranted hereon all such modifications as reasonably and properly come within the scope of our contribution to the art.

We claim:

1. A method of forming a circuit board arrangement having at least two conducting layers disposed between a pair of layers of insulating material and separated by an interposed insulating layer of epoxy resin, the conducting layers having at least one connection across the interposed insulating layer for electrically interconnecting portions of the conducting layers, the method comprising the steps of:

providing a pair of layers of insulating material with each layer having a metal conducting layer of a desired pattern on a surface thereof, each conducting layer including at least one contact point provided with a coating of bonding metal;

forming a stack of the insulating layers with an insulating layer of epoxy resin having reinforcing glass fiber interposed therebetween and with the conducting layers facing toward the layer of epoxy resin with the contact points being aligned, said epoxy resin having a curing temperature less than the melting temperature of the bonding metal;

heating the stack to a temperature above the curing temperature of the epoxy resin layer and below the melting point of the bonding metal to cause the epoxy resin to become liquid and then start jelling, and while the stack is in the heated condition, applying pressure to the stack to force the coatings of bonding metal of the aligned contact points against the liquid layer of epoxy resin to push the jelling resin and the reinforcing glass fiber from between the aligned contact points to bring the coating of bonding metal of the aligned contact points together which coatings of bonding metal under the influence of the temperature and pressure condition form a bond between the aligned contact points to interconnect the conducting layers without stressing the conducting layers.

2. A method according to claim 1, wherein the coating of bonding metal of the contact points is applied by a galvanic coating process.

3. A method according to claim 1, wherein the coating of bonding metal of the contact points is applied by a mechanical process while in a molten state.

4. A method according to claim 1, wherein the bonding metal has a melting point of at least 220° C.

5. A method according to claim 1, wherein the stack is heated during the heating step prior to the pressing step to approximately 180° C.

6. A method according to claim 5, wherein the bonding metal of the coating has a melting point of at least 220° C.

7. A method according to claim 1, wherein the bond between the contact points is formed by soft solder alloy and wherein the coatings of bonding metal on the contact points is a constituent of the soft solder alloy which constituents alloy at the pressure and temperature applied to the stack to form a fusion bond between the contact points.

8. A method according to claim 7, wherein the layer of bonding metal is applied to the contact point by a galvanic coating process.

9. A method according to claim 7, wherein the layer of bonding metal is applied to the contact points by a liquid state coating process.

10. A method according to claim 7, wherein the constituents of the solder alloy have a melting point of at least 220° C.

References Cited

UNITED STATES PATENTS

| | | | |
|---|---|---|---|
| 3,244,795 | 4/1966 | Latimer | 174—68.5 |
| 3,037,265 | 6/1962 | Kollmeier | 161—Digest 7 |
| 3,625,758 | 12/1971 | Stahl et al. | 117—212 |
| 2,974,284 | 3/1961 | Parker | 161—Digest 7 |
| 3,530,231 | 9/1970 | Penoyer | 174—68.5 |

FOREIGN PATENTS

| | | | |
|---|---|---|---|
| 1,345,163 | 10/1963 | France | 161—Digest 7 |

ALFRED L. LEAVITT, Primary Examiner

C. WESTON, Assistant Examiner

U.S. Cl. X.R.

29—625, 628; 117—212; 156—290; 174—68.5